(12) United States Patent
Hsu et al.

(10) Patent No.: US 7,286,380 B2
(45) Date of Patent: Oct. 23, 2007

(54) RECONFIGURABLE MEMORY BLOCK REDUNDANCY TO REPAIR DEFECTIVE INPUT/OUTPUT LINES

(75) Inventors: Pochang Hsu, Fremont, CA (US); Richard Keith Dodge, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 11/240,304

(22) Filed: Sep. 29, 2005

(65) Prior Publication Data

US 2007/0070734 A1 Mar. 29, 2007

(51) Int. Cl.
*G11C 15/00* (2006.01)
*G11C 8/00* (2006.01)

(52) U.S. Cl. .................. 365/49; 365/200; 365/230.03; 365/230.06

(58) Field of Classification Search ................. 365/49, 365/200, 189.08, 230.03, 230.06; 714/42, 714/43

See application file for complete search history.

(56) References Cited

U.S. PATENT DOCUMENTS

| | | | | |
|---|---|---|---|---|
| 5,347,484 | A | * | 9/1994 | Kwong et al. ................. 365/49 |
| 5,438,546 | A | * | 8/1995 | Ishac et al. ................... 365/49 |
| 6,219,286 | B1 | * | 4/2001 | Fuchigami et al. ......... 365/200 |
| 6,888,764 | B2 | * | 5/2005 | Shiga et al. ................ 365/200 |
| 7,073,102 | B2 | * | 7/2006 | Nicolaidis .................... 714/42 |
| 2003/0035322 | A1 | | 2/2003 | Wong |

FOREIGN PATENT DOCUMENTS

| | | |
|---|---|---|
| EP | 0797145 A1 | 9/1997 |
| EP | 1058192 A | 12/2000 |
| WO | WO 96/34391 | 10/1996 |

* cited by examiner

*Primary Examiner*—Trong Phan
(74) *Attorney, Agent, or Firm*—Blakely, Sokoloff, Taylor & Zafman LLP

(57) ABSTRACT

An embodiment of the present invention is a technique to provide a reconfigurable repair circuit in a memory device. A table structure contains a plurality of entries, each entry having a defective address word and a redundant address word. The redundant address word corresponds to a redundant block and is generated in response to a memory access to a defective input/output (I/O) line in a memory block of the memory device. A decoding circuit decodes the redundant address word to select a redundant I/O line in the redundant block to replace the defective I/O line.

20 Claims, 8 Drawing Sheets

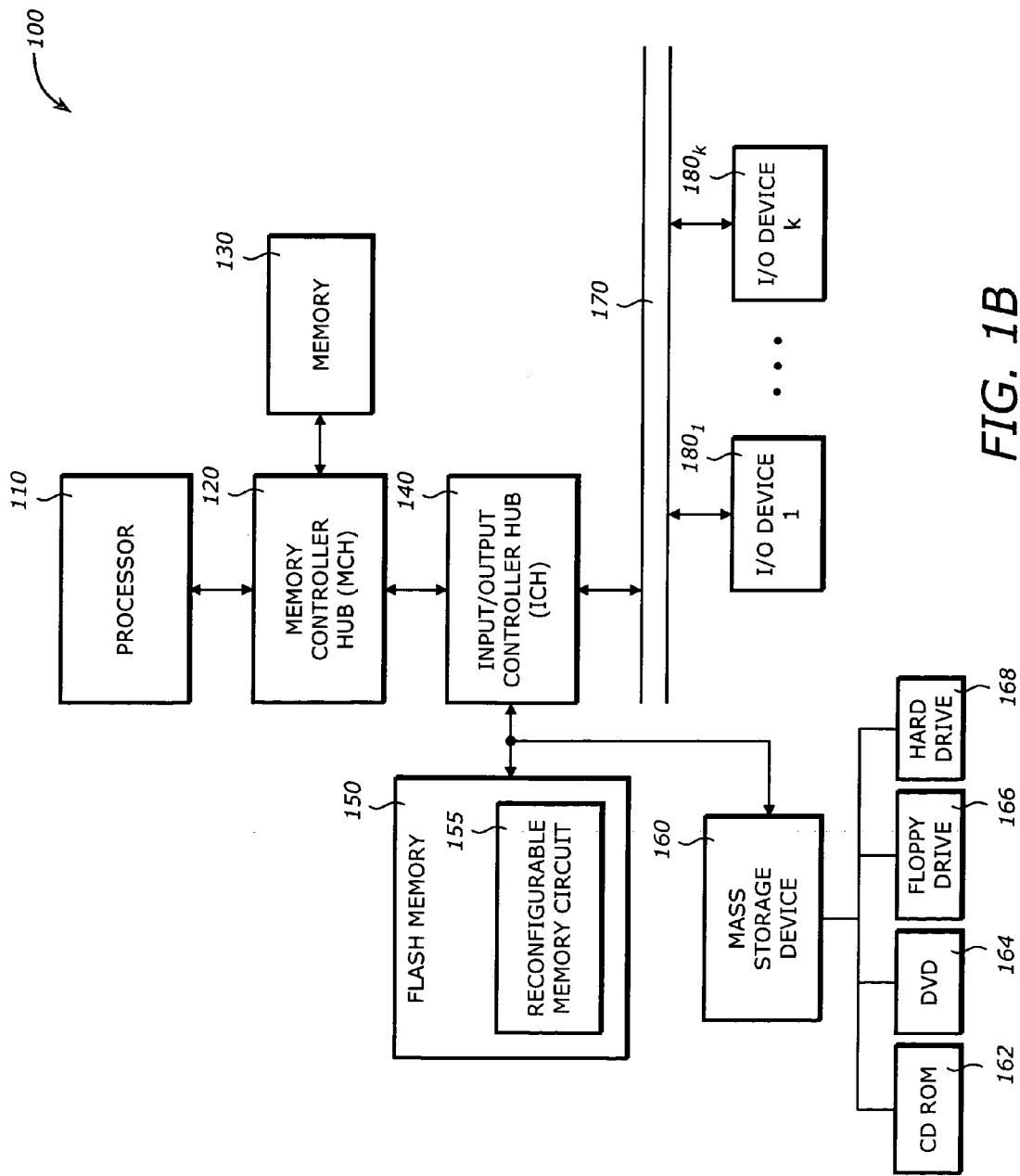

RECONFIGURABLE MEMORY BLOCK REDUNDANCY TO REPAIR DEFECTIVE INPUT/OUTPUT LINES

BACKGROUND

1. Field of the Invention

Embodiments of the invention relate to the field of memory devices, and more specifically, to redundancy in memory devices.

2. Description of Related Art

Block redundancies are normally used to repair defects that cannot be fixed with row or column redundancies in non-volatile memories such as flash memories. Defect modes such as word-line to bit-line shorts, word-line to substrate shorts (e.g., stuck-at-one or stuck-at-zero), etc. fall into the category for block repair.

Column defects such as bit-line to bit-line shorts occur often in the production of non-volatile memories. Although block redundancies may be used to repair such defects, they are costly due to increase in die size. Typically, each redundant block may result in 0.5% to 1% increase in die size depending on the block size and the density of the memory device.

BRIEF DESCRIPTION OF THE DRAWINGS

Embodiments of invention may best be understood by referring to the following description and accompanying drawings that are used to illustrate embodiments of the invention. In the drawings:

FIG. 1B is a diagram illustrating a computer system in which one embodiment of the invention can be practiced.

DESCRIPTION

An embodiment of the present invention is a technique to provide a reconfigurable repair circuit in a memory device. A table structure contains a plurality of entries, each entry having a defective address word and a redundant address word. The redundant address word corresponds to a redundant block and is generated in response to a memory access to a defective input/output (I/O) line in a memory block of the memory device. A decoding circuit decodes the redundant address word to select a redundant I/O line in the redundant block to replace the defective I/O line.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is used to repair or replace defective I/O lines using redundant blocks. Block redundancy is typically used in non-volatile memory devices such as flash memories. Flash memories may be used in numerous applications that require non-volatility, fast erasure, and high density. Examples of these applications include media players, imaging units, microprocessor systems, automotive, wireless devices, cellular phones, camcorders, cameras, printers, fax machines, copiers, scanners, signal processing systems, communication devices, network devices, television (TV) set-top box, sampling keyboard, vending machines, personal digital assistants (PDA's), etc. Typical features of such a flash memory device may include block erase and program automation, synchronous burst mode reads, asynchronous page mode reads, low power (e.g., 3V to 3.6V), block locking, block erase/program lockout during power transitions, fast access time (e.g., up to 50 MHz zero wait state), separate code and data storage, etc.

Figure 1A:
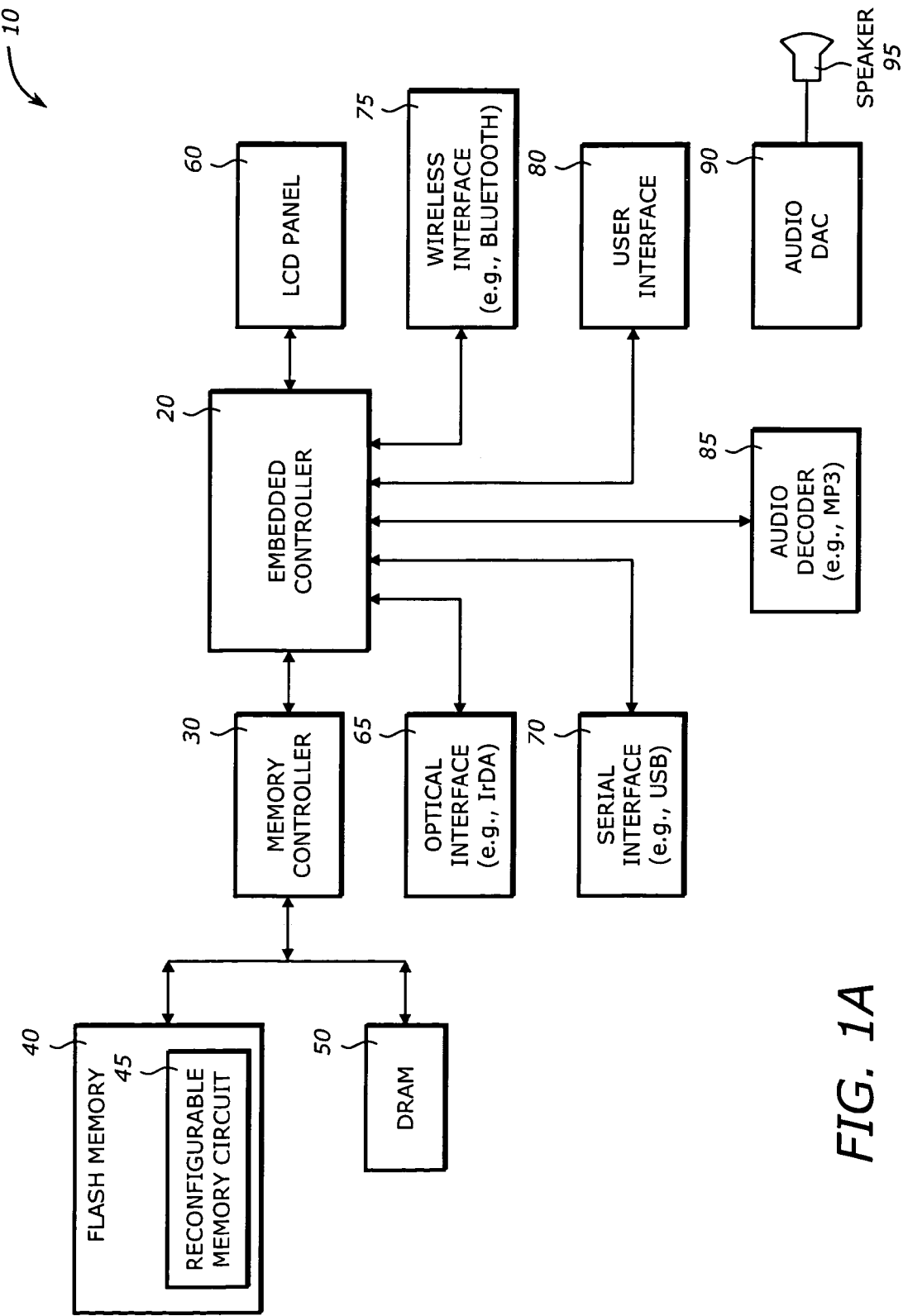
FIG. 1A is a diagram illustrating a music player in which one embodiment of the invention can be practiced.

FIG. 1A is a diagram illustrating a music player 10 in which one embodiment of the invention can be practiced. The music player 10 includes an embedded controller 20, a memory controller 30, a flash memory 40, a dynamic random access memory (DRAM) 50, a liquid crystal display (LCD) panel 60, an optical interface 65, a serial interface 70, a wireless interface 75, a user interface 80, an audio decoder 85, an audio digital-to-analog converter (DAC) 90, and a speaker unit 95.

The embedded controller 20 may be any processing unit that executes programs or instructions. It may be a microprocessor, a microcontroller, a digital signal processor (DSP), or a specially designed processor for audio processing. The memory controller 30 performs memory control functions on the flash memory 40 and the DRAM 50 to allow the processor 20 to access these memory devices. The memory controller 30 may also be integrated in the processor 20. The flash memory 40 stores non-volatile information such as program or data. It may include boot-up code, basic input/output system (BIOS), device drivers, operating system, etc. It includes a reconfigurable memory circuit 45. The reconfigurable memory circuit 45 includes normal memory blocks and redundant memory blocks. The redundant memory blocks may be reconfigured to repair defective I/O lines in the normal memory blocks. The DRAM 50 stores program and/or data including programs executed by the processor 20 to perform the operations described below. The DRAM may also store an operating system for the music player. The LCD panel 60 provides low-power display of status or interactive information such as a graphics user interface (GUI), graphics, texts, menus, status, etc.

The optical interface 65 provides interface to a wireless device such as a remote controller. The optical interface 65 may follow the Infrared Data Association (IrDA) standard. It may include any appropriate layers for infrared (Ir) interface such as the IrDA physical layer, the IrDA Link Access Protocol (IrLAP), the IrDA Link Management Protocol (IrLMP), Ir Transport Protocol (IrTP), etc. The data rate for the Ir interface may be 9.6 kilobits per second (kbps), 19.2 kbps, or as high as 1.152 Mega bits per second (Mbps). The optical interface 65 provides a directed, point-to-point connectivity with a remote device.

The serial interface 70 provides interface to a device that supports serial communication. Examples of a serial communication include Universal Serial Bus (USB) interface. Devices that are connected to the serial interface 70 may include mass storage unit, other audio player, etc. The wireless interface 75 provides wireless connectivity using signals other than infrared such as radio frequency (RF) signals. A typical wireless standard is the Bluetooth with security feature. It provides access to a personal area network (PAN) with transmission distances ranging from 10 meters to up to 100 meters. The user interface 80 provides interface to a user such as keyboard, mouse, input entry device, etc. It may also include interface to other audio devices such as microphone, stereo headphones, etc.

The audio decoder 85 decodes audio files or data such as sound or music recording. It may use a Motion Picture Experts Group (MPEG)-1 Audio Layer 3 (MP3) decoder. It may also perform format conversion of one audio format to another. The audio formats may be MP3, Waveform (WAV), Windows Media Audio (WMA), Vector Quantization Format (VQF), OGG, or any other suitable format. The audio DAC 90 converts the digital audio data stream generated by the audio decoder into analog audio signal. Other analog components (not shown) such as signal conditioner, filter, amplifiers may be included to provide a high quality audio signal. The speaker unit 95 may include a pair of stereo speakers.

FIG. 1B is a diagram illustrating a computer system 100 in which one embodiment of the invention can be practiced. The system 100 includes a processor unit 110, a memory controller hub (MCH) 120, a main memory 130, an input/output controller hub (IOH) 140, a flash memory 150, a mass storage device 160, an interconnect 170, and input/output (I/O devices $180_1$ to $180_K$.

The processor unit 110 represents a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture.

The MCH 120 provides control and configuration of memory and input/output devices such as the main memory 130 and the ICH 140. The MCH 120 may be integrated into a chipset that integrates multiple functionalities such as graphics, media, isolated execution mode, host-to-peripheral bus interface, memory control, power management, etc. The MCH 120 or the memory controller functionality in the MCH 120 may be integrated in the processor unit 110. In some embodiments, the memory controller, either internal or external to the processor unit 110, may work for all cores or processors in the processor unit 110. In other embodiments, it may include different portions that may work separately for different cores or processors in the processor unit 110.

The main memory 130 stores system code and data. The main memory 130 is typically implemented with dynamic random access memory (DRAM), static random access memory (SRAM), or any other types of memories including those that do not need to be refreshed.

The ICH 140 has a number of functionalities that are designed to support I/O functions. The ICH 140 may also be integrated into a chipset together or separate from the MCH 120 to perform I/O functions. The ICH 140 may include a number of interface and I/O functions such as peripheral component interconnect (PCI) bus interface, processor interface, interrupt controller, direct memory access (DMA) controller, power management logic, timer, system management bus (SMBus), universal serial bus (USB) interface, mass storage interface, low pin count (LPC) interface, etc.

The flash memory 150 contains non-volatile memory such as boot-up code, basic input/output system (BIOS), or any other program or data that need to be non-volatile. The flash memory 150 may be controlled by the MCH 120 or the ICH 140. It may include a reconfigurable memory circuit 155. The reconfigurable memory circuit 155 may include normal memory blocks and redundant blocks. It provides an efficient means to reconfigure the redundant blocks according to the failure patterns of the flash memory 150. The redundant blocks are used to replace defective I/O lines identified during the manufacturing process.

The mass storage device 160 stores archive information such as code, programs, files, data, and applications. The mass storage device 160 may include compact disk (CD) read-only memory (ROM) 162, digital video/versatile disc (DVD) 164, floppy drive 166, and hard drive 168, or any other magnetic or optic storage devices. The mass storage device 160 provides a mechanism to read machine-accessible media.

The interconnect 170 provides interface to peripheral devices. The interconnect 170 may be point-to-point or connected to multiple devices. For clarity, not all of the interconnects are shown. It is contemplated that the interconnect 170 may include any interconnect or bus such as Peripheral Component Interconnect (PCI), PCI Express, Universal Serial Bus (USB), and Direct Media Interface (DMI), etc.

The I/O devices $180_1$ to $180_K$ may include any I/O devices to perform I/O functions. Examples of I/O devices $180_1$ to $180_K$ include controller for input devices (e.g., keyboard, mouse, trackball, pointing device), media card (e.g., audio, video, graphics), network card, and any other peripheral controllers.

Figure 2:
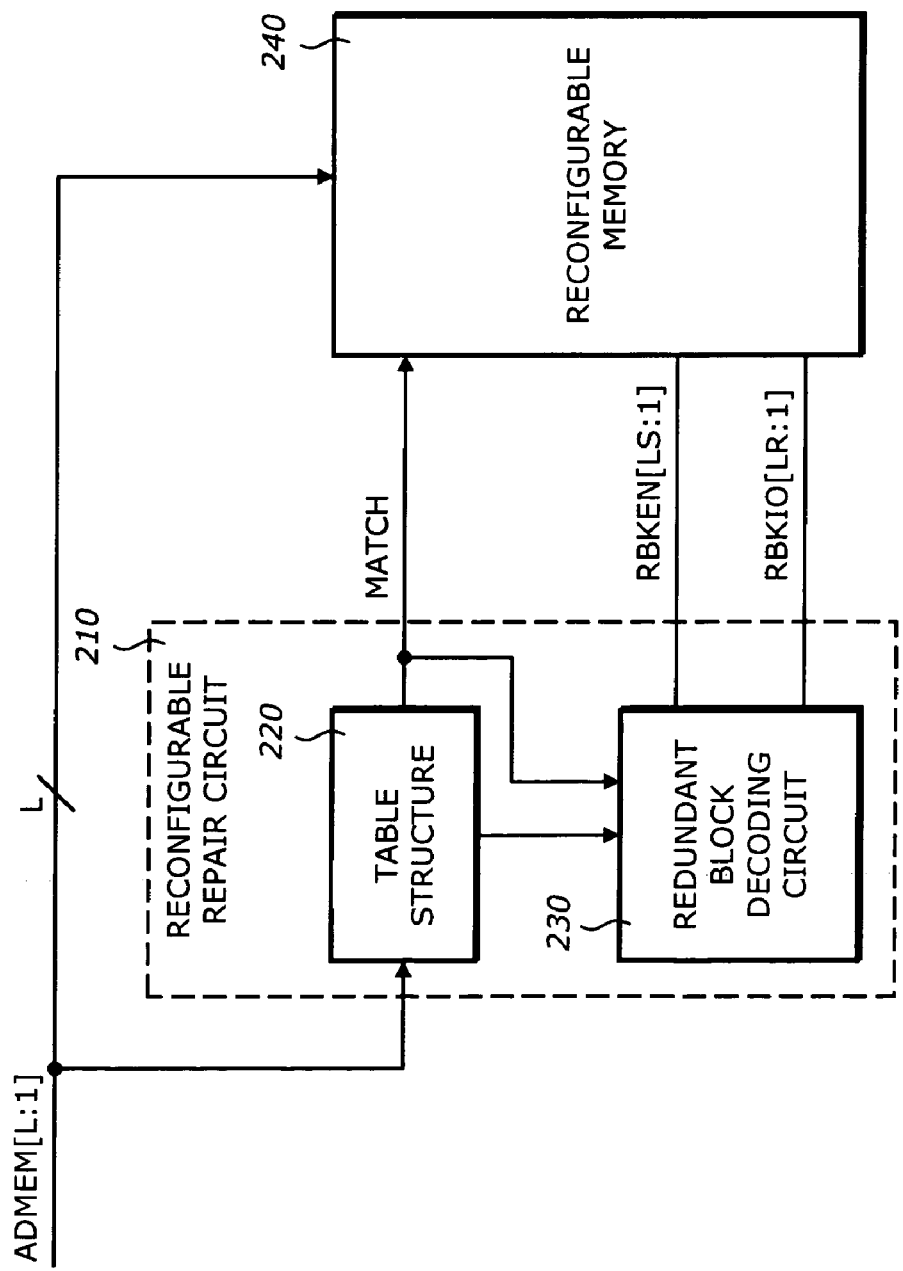
FIG. 2 is a diagram illustrating a reconfigurable memory circuit according to one embodiment of the invention.

FIG. 2 is a diagram illustrating the reconfigurable memory circuit 45/155 shown in FIGS. 1A and 1B according to one embodiment of the invention. The reconfigurable memory circuit 65 includes a reconfigurable repair circuit 210 and a reconfigurable memory 240.

The reconfigurable repair circuit 210 receives the address information ADMEM[L:1] of a memory access to the memory device 40/150 (FIGS. 1A and 1B). The memory access is performed by the processor 20/110 or the memory controller 30 or the MCH 120/ICH 140. The reconfigurable repair circuit 210 may include a table structure 220 and a redundant block decoding circuit 230. The table structure 220 has a number of entries that contain addresses of the defective I/O lines in the reconfigurable memory 240 and the addresses of the redundant I/O lines that replace the corresponding defective I/O lines. The entries may be programmed or configured during the testing of the memory device at the manufacturing phase. The testing reveals the specific I/O lines that are defective due to failures such as bit line to bit line shorts. These failures may be efficiently repaired using the redundant blocks in the reconfigurable memory 240. The table structure 220 generates a matching signal MATCH to indicate if the memory access address ADMEM[L:1] matches a defective I/O address. It also provides the address information of the I/O line in a redundant block in the reconfigurable memory 240 that may be used to replace the defective I/O line. The redundant decoding circuit 230 decodes the address information of the I/O line to generate redundant block enable signals RBKEN[LS:1] to select or enable the redundant block that contains the replacing I/O line and the redundant block I/O address RBKIO[LR:1] to select the specific replacing I/O line.

The reconfigurable memory 240 contains normal memory blocks and redundant memory blocks. The redundant memory blocks are used to repair any defective blocks or any defective I/O line. When there is a memory access that generates the address ADMEM[L:1], the reconfigurable repair circuit 210 checks if the access is to a defective I/O line. If not, it negates the MATCH signal to disable the redundant memory blocks and to enable the normal memory block that corresponds to the memory address so that a normal access may take place. If the access is to a defective I/O line, the reconfigurable repair circuit 210 asserts the MATCH signal to enable the redundant memory block that contains a redundant I/O line that replaces the defective I/O line and to disable the normal memory block that contains the defective I/O line.

Figure 3:
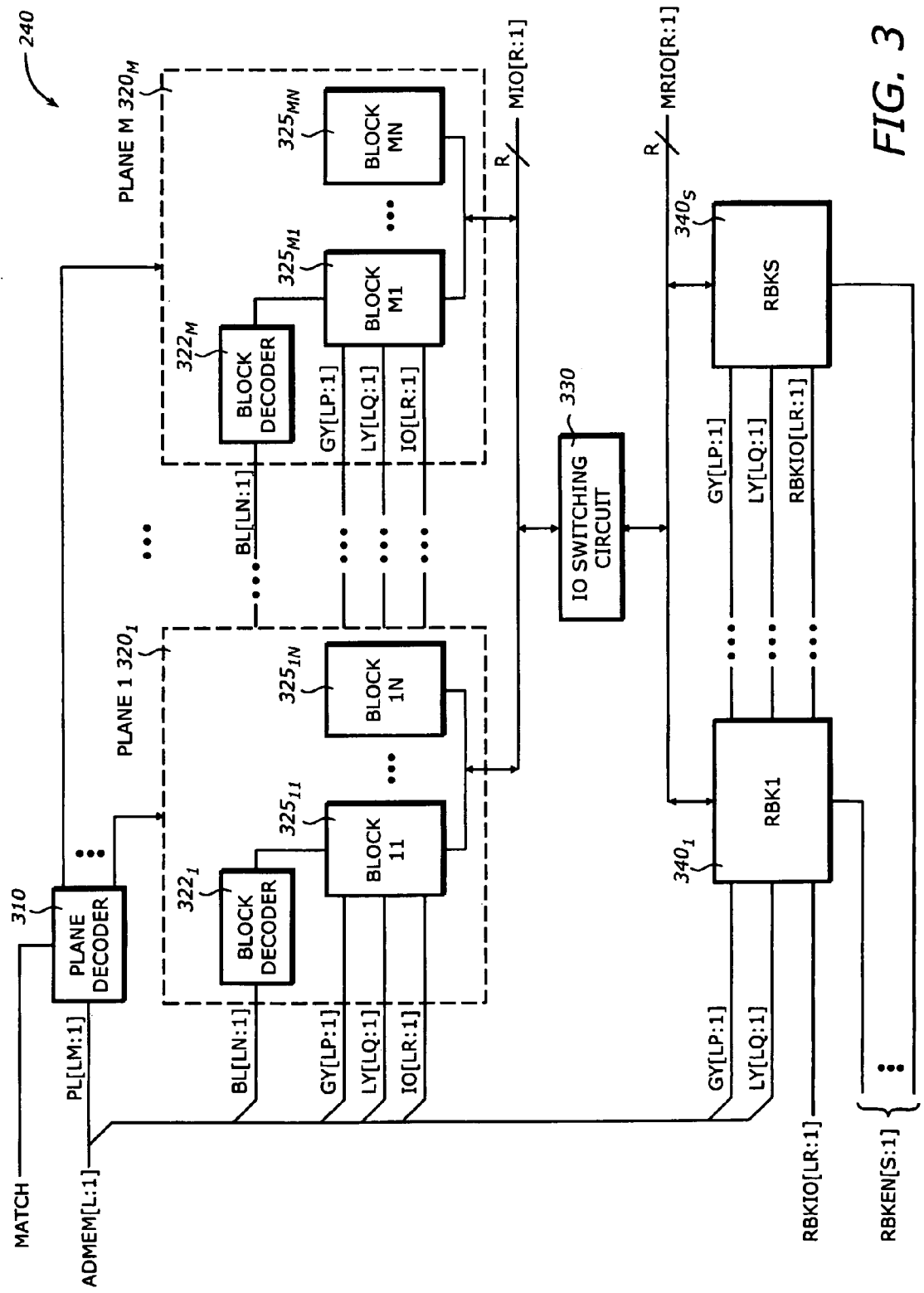
FIG. 3 is a diagram illustrating a reconfigurable memory with redundant blocks according to one embodiment of the invention.

FIG. 3 is a diagram illustrating the reconfigurable memory 240 with redundant blocks shown in FIG. 2 according to one embodiment of the invention. The reconfigurable memory 240 includes a plane decoder 310, M memory planes $320_1$ to $320_M$, an I/O switching circuit 330, and S redundant memory blocks $340_1$ to $340_S$.

The address information ADMEM[L:1] may consist of five fields according to the organization of the memory device: a plane address field PL[LM:1] having LM bits, a block address field BL[LN:1] having LN bits, a global bit line address field GY[LP:1] having LP bits, a local bit line address field LY[LQ:1] having LQ bits, and an I/O address field IO[LR:1] having LR bits. The number of bits in the address ADMEM[L:1] is L and is equal to the sum of LM, LN, LP, LQ, and LR.

The memory device is organized to have M memory planes. Each plane has N memory blocks. Each block is organized into P global lines and Q local lines. There are R I/O lines MIO[R:1]. The values LM, LN, LP, LQ, and LR are the logarithms (base 2) of the values M, N, P, Q, and R, respectively. For example, suppose a memory device has a density of 128 Mb. There are 16 planes and each plane has 8 blocks. Each block is organized as 1K by 1K to have 1 Mb. For column addressing, in each block, there are 8 global bit lines, 16 local bit lines and 8 I/O lines. The values are: M=16, N=8, P=8, Q=16, and R=8. The field sizes are: LM=4, LN=3, LP=3, LQ=4, and LR=3. Therefore, L=17.

The plane decoder 310 decodes the plane address PL[LM:1] to select or enable the M memory planes $320_1$ to $320_M$. The memory planes have identical organization. For example, plane $320_1$ includes a block decoder $322_1$ and N blocks $325_{11}$ to $325_{1N}$. Similarly, plane $320_M$ has a block decoder $322_M$ and N blocks $325_{M1}$ to $325_{MN}$. The block decoder $322_{j1}$ decodes the block address lines BL[LN:1] to select or enable the N blocks $325_{j1}$ to $325_{jM}$ where j=1, ..., M. The I/O lines of the memory blocks form the MIO[R:1] lines.

The I/O switching circuit 330 switches the I/O lines between the MIO[R:1] and the MRIO[R:1] of the redundant blocks RBK1 $340_1$ to RBKS $340_S$. This allows a replacement of an I/O line j of the MIO[R:1] by an I/O line k of the MRIO[R:1]. The I/O switching circuit 330 may include bi-directional transceivers and logic circuit to realize the switching or mapping function.

The S redundant blocks RBK1 $340_1$ to RBKS $340_S$ are blocks that are designed for repair or replacement purposes. These blocks are used for repairing defective I/O lines. It is contemplated that there are redundant blocks that are used to repair an entire block in the memory planes $320_1$ to $320_M$. The redundant blocks RBK1 $340_1$ to RBKS $340_S$ receive the global bit line address GY[LP:1] and local bit line address LY[LQ:1] from the address information ADMEM[L:1] to decode the global and local bit lines. They receive the redundant block enable signals RBKEN[LS:1] and the redundant block I/O line address RBKIO[LR:1] from the redundant block decoding circuit 230 to decode the individual I/O lines.

Figure 4:
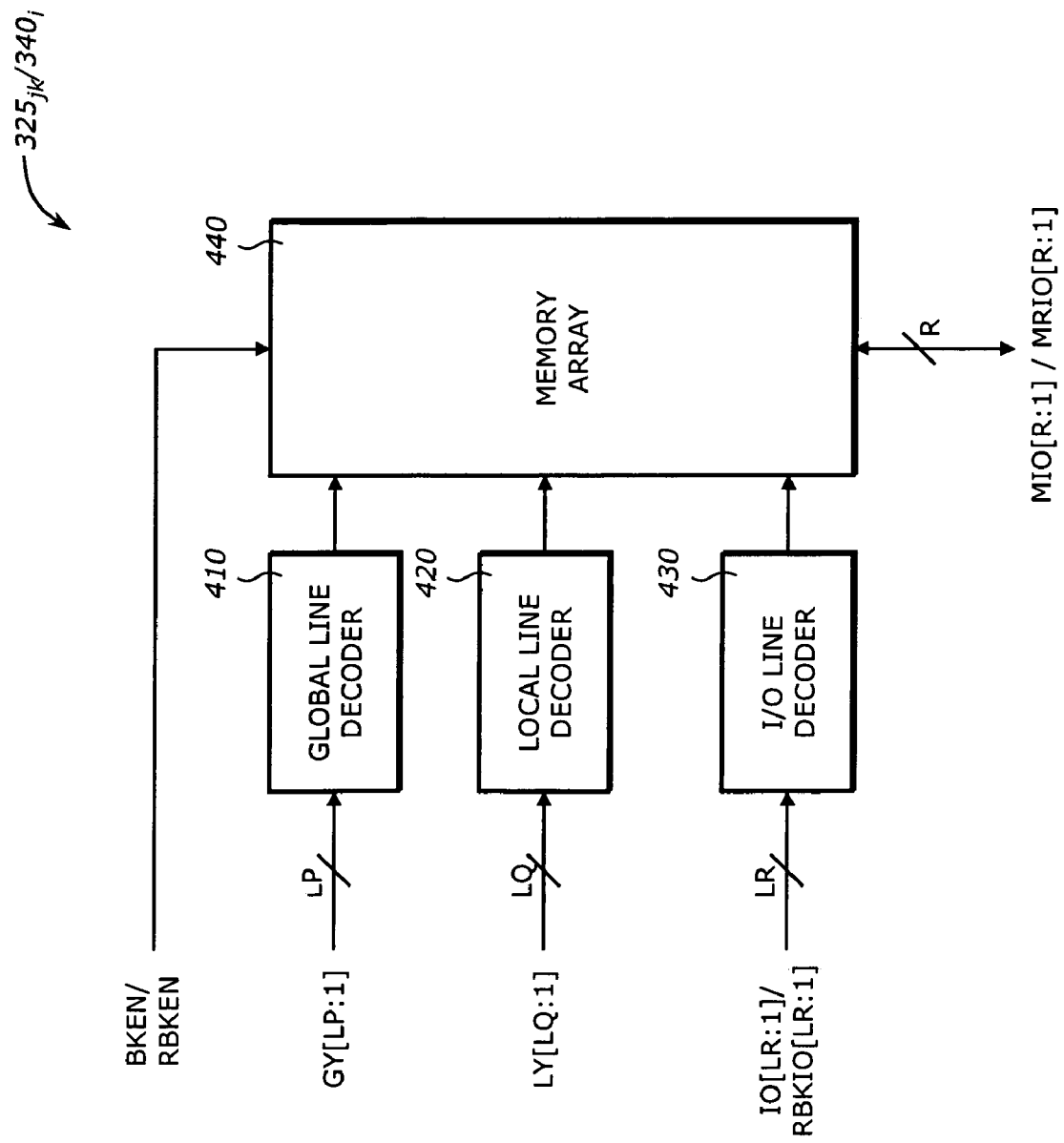
FIG. 4 is a diagram illustrating a memory block according to one embodiment of the invention.

FIG. 4 is a diagram illustrating the memory block $325_{jk}$/$340_i$ according to one embodiment of the invention. The memory block $325_{jk}$/$340_i$ is representative of the memory block $325_{jk}$ shown in FIG. 3 (j=1, ... M, k=1, ..., N), and $340_i$ (i=1, ..., S). It includes a global line decoder 410, a local line decoder 420, an I/O line decoder 430 and a memory array 440.

The global line decoder 410 decodes the global line address GY[LP:1]. The local line decoder 420 decodes the local line address LY[LQ:1]. The I/O line decoder decodes the I/O line address IO[LR:1] (for the memory block $325_{jk}$, j=1, ... M, k=1, ..., N) or RBKIO[LR:1] (for the redundant block $340_i$, i=1, ..., S).

The memory array 440 receives the decoded global, local, and I/O addresses to enable or select the I/O lines MIO[R:1] (for the memory block $325_{jk}$, j=1, ... M, k=1, ..., N) or MRIO[R:1] (for the redundant block $340_i$, i=1, ..., S). The memory array 440 is enabled by the block enable signals BKEN from the block decoder $322_j$, j=1, ..., M (FIG. 3), or RBKEN[LS:1] from the redundant block decoding circuit 230 (FIG. 2).

Figure 5:
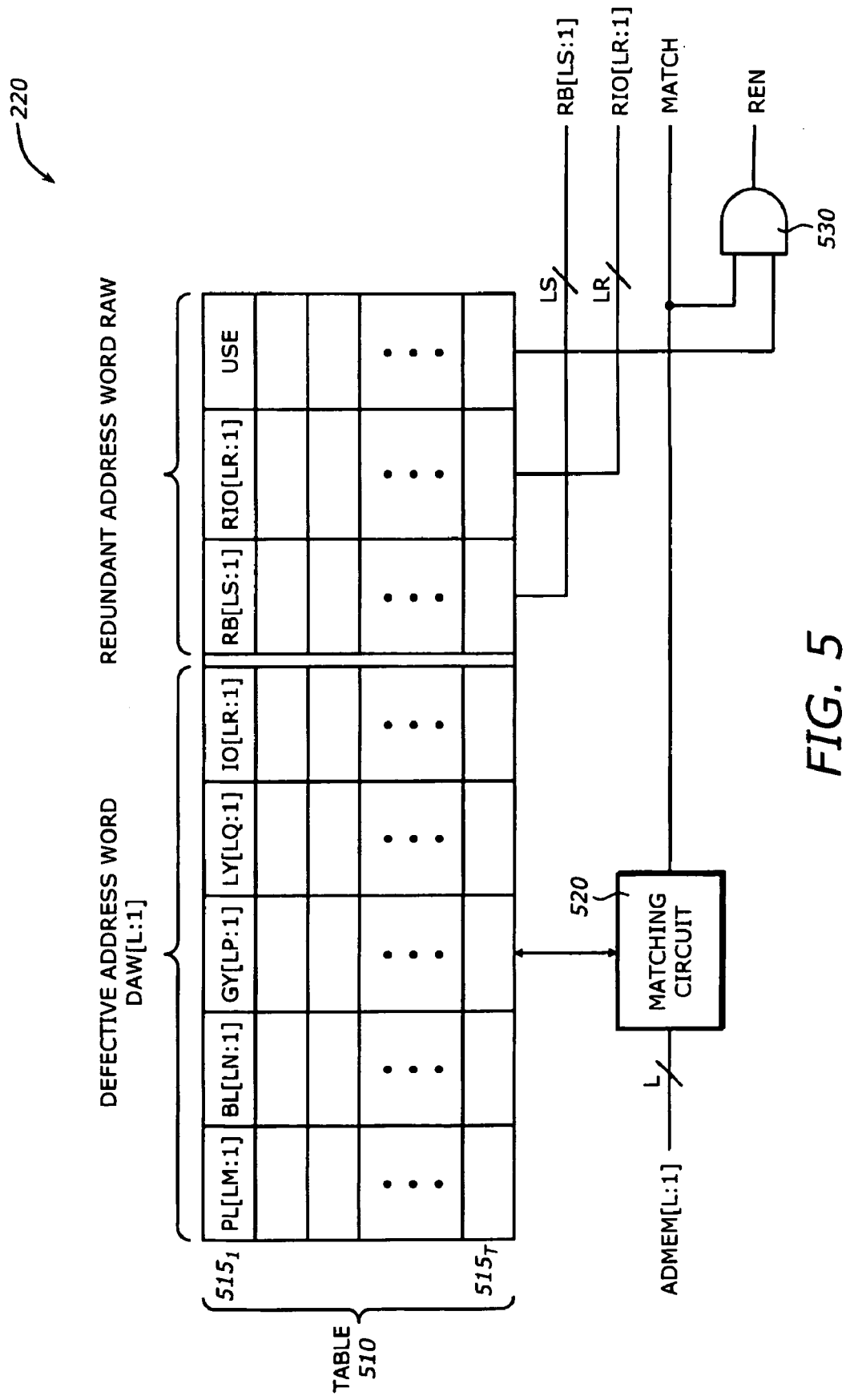
FIG. 5 is a diagram illustrating a table structure according to one embodiment of the invention.

FIG. 5 is a diagram illustrating the table structure 220 shown in FIG. 2 according to one embodiment of the invention. The table structure 220 includes a table 510, a matching circuit 520, and a gating circuit 530.

The table 510 and the matching circuit 520 may be part of a content addressable memory (CAM) or an associative memory. The table 510 contains a number of entries $515_1$ to $515_T$. Each entry corresponds to a defective I/O line. The table entries are organized into two parts: a defective address word (DAW) and the redundant address word (RAW). The DAW is the address for the defective I/O line and the RAW is the address of the replacing I/O line in the redundant block.

The DAW may be an argument or input for a CAM. The RAW is the data associated with the argument. When an input, in this case the address information ADMEM[L:1], is presented to the argument, the CAM logic or the matching circuit 520 performs a match or search to determine if there is any entry that has the argument matched with the input ADMEM[L:1]. If not, the matching circuit 520 negates a MATCH signal. Otherwise, it asserts the MATCH signal and enable the associated RAW to be output to the decoding circuit 230.

The DAW has L bits and is organized into five fields corresponding to the address fields for the memory I/O lines. These fields include the plane address field PL[LM:1] having LM bits, the block address field BL[LN:1] having LN bits, the global bit line address field GY[LP:1] having LP bits, the local bit line address field LY[LQ:1] having LQ bits, and the I/O address field IO[LR:1] having LR bits. The specific address values of these fields are determined during the testing at the manufacturing phase of the memory device when the defective I/O lines are determined. These bits are programmed or reconfigured at the manufacturing phase after the defective I/O lines have been identified.

The RAW has W bits and is organized into three fields. These fields include the redundant block address field RB[LS:1] having LS bits, the redundant I/O address field RIO[LR:1], and a USE field having one bit. The word length W of the RAW is equal to the sum of LS, LR and 1. The redundant block address RB[LS:1] specifies the redundant block used for the replacement. The redundant I/O address RIO[LR:1] specifies the I/O line in the specified redundant block that is used to replace the defective I/O line specified in the corresponding DAW. The USE bit is used to indicate that the CAM entry has been used or the redundant block is used. It is asserted if the entry is used and negated if the entry is not used. In another embodiment, there may be as many RAWs as the number of redundant blocks. Each RAW corresponds to a redundant block. In other embodiments, there may be more than one RAWs for the same redundant block.

The gating circuit 530 is used to gate the USE bit with the MATCH signal to enable the redundant block decoding circuit 230.

Figure 6:
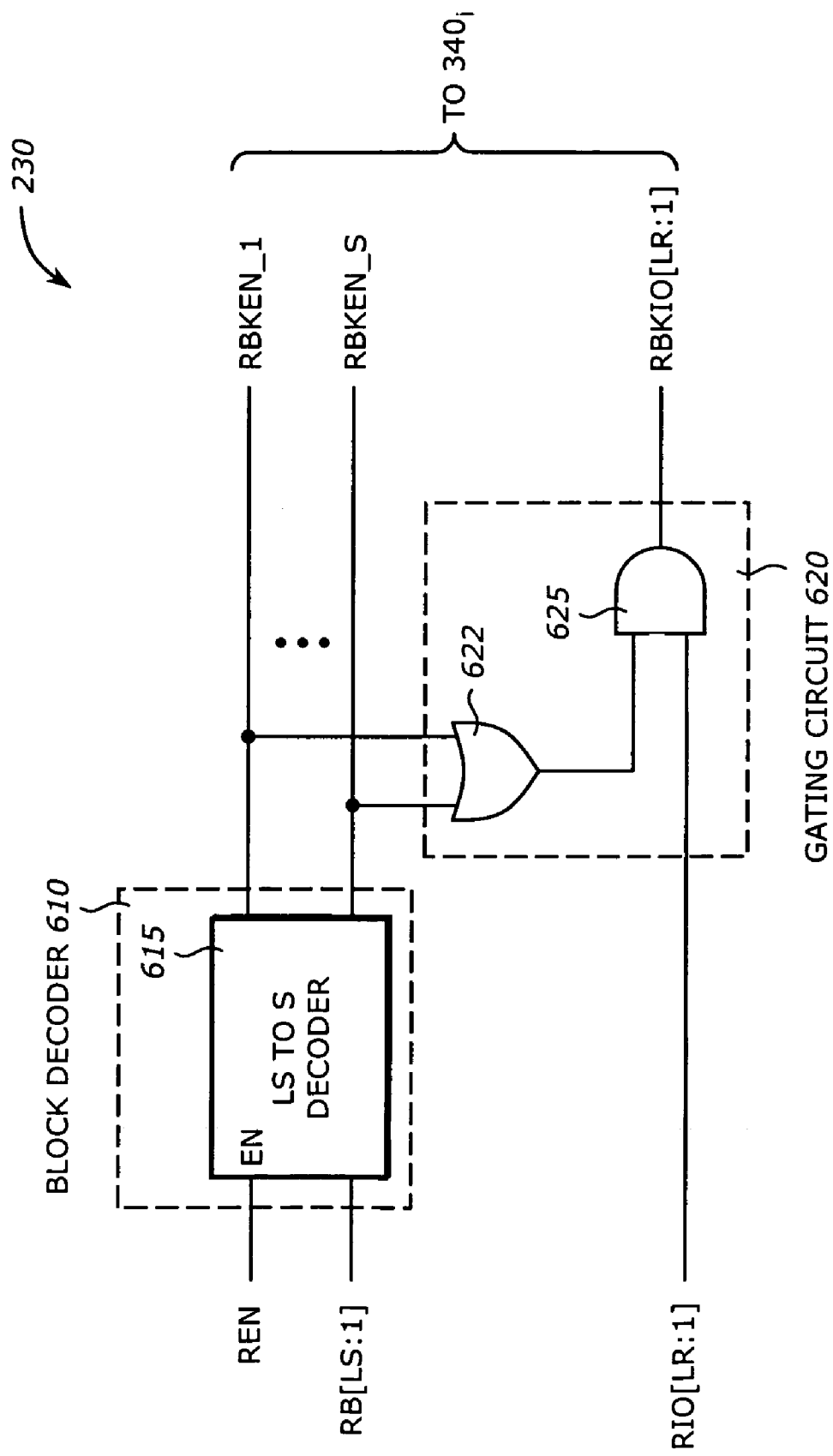
FIG. 6 is a diagram illustrating a redundant block decoding circuit according to one embodiment of the invention.

FIG. 6 is a diagram illustrating the redundant block decoding circuit 230 shown in FIG. 2 according to one embodiment of the invention. The decoding circuit 230 includes a block decoder 610 and a gating circuit 620.

The block decoder 610 decodes the redundant block address RB[LS:1] in the redundant address word RAW generated from the table 510 (FIG. 5) to select the redundant block. The block decoder 610 includes a LS-to-S decoder 615. The decoder 615 receives the LS bits from the redundant block address RB[LS:1] and generates S signals RBKEN_1 to RBKEN_S to enable a redundant block. The block decoder 610 is enabled by the enable signal REN generated from the table structure 220 (FIG. 5).

The gating circuit 620 gates the redundant I/O address RIO[LR:1] in the redundant address word RAW with the decoded redundant block address to select the redundant I/O line in the selected redundant block. It includes an OR gate 622 and an AND gate 625. For LR bits, there are LR such AND gates 625. The OR gate 622 asserts a true signal when one of the decoded output is true indicating that a redundant block is being selected. The AND gate 625 let the redundant I/O address RIO [LR:1] to pass through to go the redundant blocks to select an I/O line in the selected redundant block.

Figure 7:
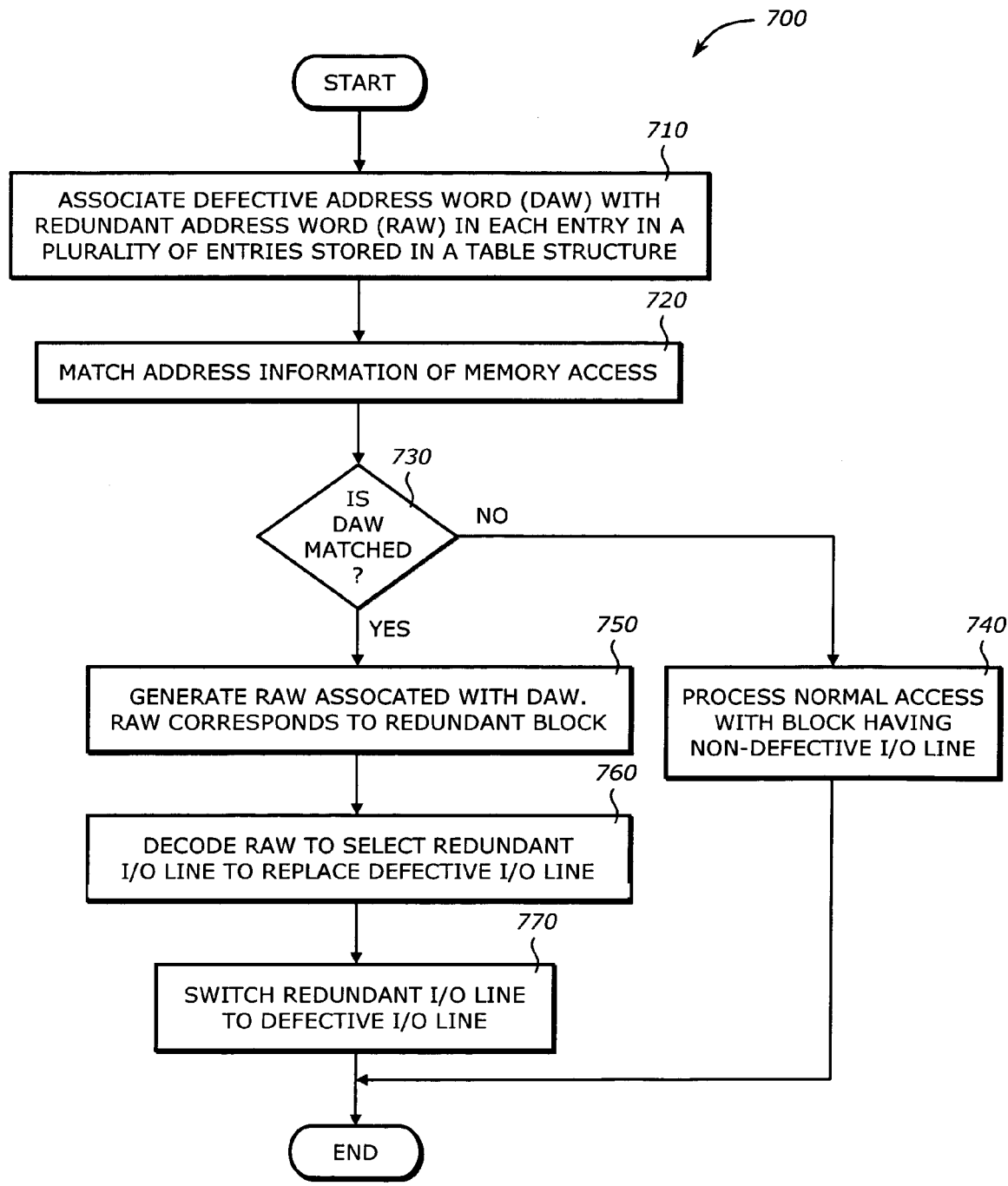
FIG. 7 is a flowchart illustrating a process to reconfigure redundant blocks according to one embodiment of the invention.

FIG. 7 is a flowchart illustrating a process 700 to reconfigure redundant blocks according to one embodiment of the invention.

Upon START, the process 700 associates a defective address word (DAW) with a redundant address word (RAW) in each entry in a plurality of entries stored in a table (Block 710). This may include associating a plane address corresponding the a plane containing the defective I/O line, associating a block address corresponding to the memory block, associating a global bit line address corresponding to a global bit line of the defective I/O line, associating a local bit line address corresponding to a local bit line of the defective I/O line, and associating an I/Oaddress corresponding to the defective I/O line. Next, the process 700 matches the address information of a memory access from a processor (Block 720). The memory access may be a read access or a write access. Then, the process 700 determines if the DAW is matched (Block 730). If not, the memory access does not access a defective I/O line and the process 700 proceeds with a normal access with the addressed block having a non-defective I/O line (Block 740) and is then terminated. Otherwise, the memory access accesses a defective I/O line and the process 700 generates a RAW associated with the DAW (Block 750). The RAW corresponds to a redundant block.

Next, the process 700 decodes the RAW to select a redundant I/O line to replace the defective I/O line (Block 760). Then, the process 700 switches the redundant I/O line to the defective I/O line (Block 770) and is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a table structure containing a plurality of entries, each entry having a defective address word and a redundant address word, the redundant address word corresponding to a redundant block and being generated in response to a memory access to a defective input/output (I/O) line in a memory block of a memory device; and
   a decoding circuit coupled to the table to decode the redundant address word to select a redundant I/O line in the redundant block to replace the defective I/O line.

2. The apparatus of claim 1 wherein the table structure comprises:
   a table to store the plurality of entries; and
   a matching logic coupled to the table to match address information of the memory access with the defective address word of each entry, the matching logic providing an enable signal to the decoding circuit when the address information matches the defective address word.

3. The apparatus of claim 1 wherein the defective address word comprises:
   a plane address corresponding the a plane containing the defective I/O line;
   a block address corresponding to the memory block;
   a global bit line address corresponding to a global bit line of the defective I/O line;
   a local bit line address corresponding to a local bit line of the defective I/O line; and
   an I/O address corresponding to the defective I/O line.

4. The apparatus of claim 1 wherein the redundant address word comprises:
   a redundant block address corresponding the redundant block containing the redundant I/O line; and
   a redundant I/O address corresponding to the redundant I/O line.

5. The apparatus of claim 1 wherein the redundant address word further comprises:
   a use bit to indicate that an entry has been used for repair.

6. The apparatus of claim 4 wherein the decoding circuit comprises:
   a block decoder to decode the redundant block address in the redundant address word to select the redundant block, the block decoder being enabled by the enable signal; and
   a gating circuit coupled to the block decoder to gate the redundant I/O address in the redundant address word with the decoded redundant block address to select the redundant I/O line in the selected redundant block.

7. The apparatus of claim 1 wherein the table structure is a content addressable memory (CAM).

8. A method comprising:
associating a defective address word with a redundant address word in each entry in a plurality of entries stored in a table structure;
generating the redundant address word corresponding to a redundant block in response to a memory access to a defective input/output (I/O) line in a memory block of a memory device; and
decoding the redundant address word using a decoding circuit to select a redundant I/O line in the redundant block to replace the defective I/O line.

9. The method of claim 8 wherein generating the redundant address word comprises:
matching address information of the memory access with the defective address word of each entry to provide an enable signal to the decoding circuit when the address information matches the defective address word.

10. The method of claim 8 wherein associating the defective address word comprises:
associating a plane address corresponding the a plane containing the defective I/O line;
associating a block address corresponding to the memory block;
associating a global bit line address corresponding to a global bit line of the defective I/O line;
associating a local bit line address corresponding to a local bit line of the defective I/O line; and
associating an I/O address corresponding to the defective I/O line.

11. The method of claim 8 wherein associating the defective address word comprises:
associating the defective address word with a redundant block address corresponding the redundant block containing the redundant I/O line; and
associating the defective address word a redundant I/O address corresponding to the redundant I/O line.

12. The method of claim 8 wherein associating the defective address word further comprises:
associating the defective address word with a use bit to indicate that an entry has been used for repair.

13. The method of claim 11 wherein decoding comprises:
decoding the redundant block address in the redundant address word to select the redundant block, the block decoder being enabled by the enable signal; and
gating the redundant I/O address in the redundant address word with the decoded redundant block address to select the redundant I/O line in the selected redundant block.

14. The method of claim 8 wherein associating a defective address word with a redundant address word comprises:
constructing the table structure using a content addressable memory (CAM).

15. A system comprising:
a processor;
an audio decoder coupled to the processor to decode audio data encoded in an audio encoding format; and
a memory controller coupled to the processor to control a memory device, the memory device having a reconfigurable memory and a reconfigurable repair circuit, the reconfigurable memory having a plurality of memory blocks and a plurality of redundant blocks, the reconfigurable repair circuit comprising:
a table structure containing a plurality of entries, each entry having a defective address word and a redundant address word, the redundant address word corresponding to a redundant block in the plurality of redundant blocks and being generated in response to a memory access by the processor to a defective input/output (I/O) line in a memory block in the plurality of memory blocks, and a decoding circuit coupled to the table to decode the second address word to select a redundant I/O line in the redundant block to replace the defective I/O line.

16. The system of claim 15 wherein the table structure comprises:
a table to store the plurality of entries; and
a matching logic to match address information of the memory access with the defective address word of each entry, the matching logic providing an enable signal to the decoding circuit when the address information matches the defective address word.

17. The system of claim 15 wherein the defective address word comprises:
a plane address corresponding the a plane containing the defective I/O line;
a block address corresponding to the memory block;
a global bit line address corresponding to a global bit line of the defective I/O line;
a local bit line address corresponding to a local bit line of the defective I/O line; and
an I/O address corresponding to the defective I/O line.

18. The system of claim 15 wherein the redundant address word comprises:
a redundant block address corresponding the redundant block containing the redundant I/O line; and
a redundant I/O address corresponding to the redundant I/O line.

19. The system of claim 15 wherein the redundant address word further comprises:
a use bit to indicate that an entry has been used for repair.

20. The system of claim 18 wherein the decoding circuit comprises:
a block decoder to decode the redundant block address in the redundant address word to select the redundant block, the block decoder being enabled by the enable signal; and
a gating circuit coupled to the block decoder to gate the redundant I/O address in the redundant address word with the decoded redundant block address to select the redundant I/O line in the selected redundant block.

* * * * *